United States Patent [19]

Rauscher

[11] 4,188,669

[45] Feb. 12, 1980

[54] DECODER FOR VARIABLE-LENGTH CODES

[75] Inventor: Tomlinson G. Rauscher, Wayland, Mass.

[73] Assignee: NCR Corporation, Dayton, Ohio

[21] Appl. No.: 869,961

[22] Filed: Jan. 13, 1978

[51] Int. Cl.$^2$ .............................................. G06F 7/02
[52] U.S. Cl. ............................. 364/900; 340/347 DD
[58] Field of Search ... 364/200 MS File, 900 MS File; 340/347 DD

[56] References Cited

U.S. PATENT DOCUMENTS

| | | | |
|---|---|---|---|
| 3,675,212 | 7/1972 | Raviv et al. ................. | 340/347 DD |
| 3,701,108 | 10/1972 | Loh et al. ..................... | 340/347 DD |
| 3,717,851 | 2/1973 | Cocke et al. ......................... | 364/200 |
| 3,771,139 | 11/1973 | Digby ................................. | 364/200 |
| 3,918,047 | 11/1975 | Denes ........................... | 340/347 DD |

Primary Examiner—Harvey E. Springborn
Attorney, Agent, or Firm—J. T. Cavender; Wilbert Hawk, Jr.; Richard W. Lavin

[57] ABSTRACT

Each data element in an inputted variable-length code word is matched simultaneously with correspondingly positioned data elements stored in a pair of memory units. The first memory unit has stored therein a plurality of variable-length code words which by their stored position in the memory unit represents the coded information contained in the inputted variable-length code word. The second memory unit has stored therein length-defining words each indicating the length of the corresponding variable-length code word stored in the first memory unit. The data elements of each corresponding word stored in both memory units and the variable-length code word are applied to substantially similar compare logic modules for outputting a signal which can be used to identify the information represented by the inputted variable-length coded word when a coincidence is found between one of the code words stored in the first memory unit and the inputted variable-length code word together with the sensing of the corresponding length-defining word stored in the second memory unit.

18 Claims, 5 Drawing Figures

DECODER FOR VARIABLE-LENGTH CODES

BACKGROUND OF THE INVENTION

The present invention is directed to an apparatus for decoding variable length instantaneous codes. Binary codes are used in present day data processing systems for representing normal data processing information such as alphanumeric characters, computer instructions, messages and various graphic entities. These codes are usually of fixed-length due to the fixed size of the storage elements in computer memories and the simplicity of implementing fixed-length decoders. It has been recognized that the use of variable-length code words provides a more efficient representation (fewer binary digits) than fixed-length code words, especially when the code words have a skewed probability distribution. This is especially the case in digital data processing where the use of bit addressable memory systems utilized in conjunction with variable-length code words can greatly reduce the amount of memory required for the processing system.

The decoding of variable-length code words residing in memory is not trivial, since in giving a coded message it is necessary to determine where the first code word ends and the next code word begins. This type of code is generally referred to as an instantaneous code wherein it is possible to decode each code word in a sequence without reference to succeeding code symbols. Inherent in instantaneous codes is the requirement that no complete word of the code be a prefix of some other code word. Example of such a code is the minimum-redundancy code described in D. A. Huffman "A Method for the Construction of Minimum-Redundancy Codes" Proceedings of IRE, Volume 40, Pp. 1098-1101, September, 1952. Prior decoding circuits for decoding Huffman type codes have usually used a tree searching technique, an example which can be found in U.S. Pat. No. 3,918,047, issued Nov. 4, 1975, to P. B. Denes which requires a number of logic circuit modules to be interconnected in a pattern corresponding to a tree representation of the code. The speed of such a decoding circuit has been found to be limited due to the number of gate delays found in such a circuit. In U.S. Pat. No. 3,701,108, issued Oct. 24, 1972 to Loh et al., a processor for encoding and decoding variable-length dependent code words is disclosed in which the fixed-length code words are assigned to a coding set based on the probability of each word occurring after a preceding word, which coding set is used in encoding and decoding the variable-length code words. This type of processing requires large memories which add to the cost of the processing system. It is therefore an object of this invention to provide a unique representation of a parallel decoder for decoding an instantaneous variable-length code. It is a further object of this invention to provide a decoder whose decoding time is significantly faster than the decoders found in the current state of the art and which is of simple construction and therefore low in cost.

SUMMARY OF THE INVENTION

These and other objects are fulfilled by providing a decoder apparatus which includes a code memory unit in which is stored a plurality of variable-length code words, a mask memory unit in which is stored code words defining the length of an associated variable-length code word stored in the code memory unit, a plurality of logic gates which output a signal representing the result of comparing the bits or data elements in an inputted variable-length code word which is to be decoded with the corresponding bits in each of the variable-length code words stored in the code memory unit and its associated length defining words stored in the mask memory unit, and a register for storing the output signal to indicate the information represented by the inputted variable-length code word.

BRIEF DESCRIPTION OF THE DRAWINGS

FIG. 3 is a Truth Table of the logic gates used in the coincident circuits of FIG. 2.

DESCRIPTION OF THE PREFERRED EMBODIMENT

The present invention will be described in relation to the decoding of a variable-length code word which represents a particular operation or routine used in controlling the operation of a central processing unit. Table I lists a limited number of computer operations and their corresponding Huffman Code representation together with their length and address with respect to their position in the Table.

TABLE I

| Operations | Address | Length | Code Word |
|---|---|---|---|
| Add | 1 | 3 | 000 |
| Load | 2 | 3 | 001 |
| Compare | 3 | 4 | 0100 |
| Multiply | 4 | 4 | 0101 |
| Divide | 5 | 4 | 0110 |
| Shift | 6 | 4 | 0111 |
| Store | 7 | 4 | 1001 |
| Branch | 8 | 4 | 1010 |

The present embodiment of the decoder will decode each code word stored in a register by generating a signal representing the address of the code word found in Table I., which address is used in a table look-up procedure for generating the information represented by the code word for use in operating the computer in a manner that is well-known in the art.

Figure 1:
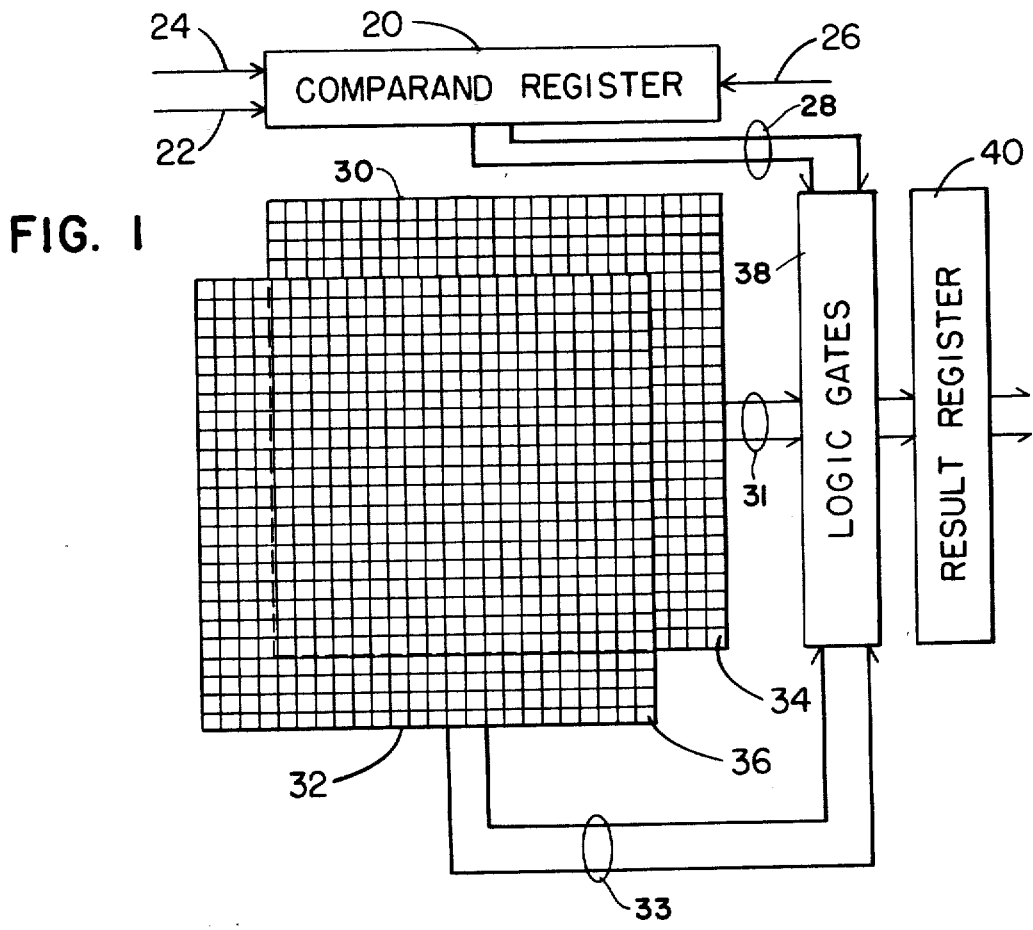
FIG. 1 shows a schematic representation of the registers and the memories utilized in the present embodiment of the decoder.

Referring to FIG. 1 wherein there is shown one embodiment of the decoder, a variable-length code word having a maximum of n bits is serially loaded into an n bit Comparand Register 20 over conductor 22 with the least significant bit of the variable-length code word being loaded first. As will become obvious from a further description of the invention, if desired, the most significant bit of the variable-length code word can also be loaded first into the register 20 without changing the operation of the decoder. The present example will assume that the Comparand Register 20 will be set to store only one code word. After the variable length code word has been stored in the Register 20 under the control of clock pulses transmitted over conductor 24 from a clock source (not shown) in a manner that is well-known in the art, a control signal transmitted over conductor 26 from a control unit (not shown) effects the simultaneous transfer via conductors 28 of the bits or data elements of the variable-length code word from the Register 20 to an array of logic gates 38 which gates also receive data from storage cells 34 of a Code Memory unit 30 and storage cells 36 of Mask Memory unit 32 in the manner to be described in greater detail hereinafter.

The storage cells 34 of the Code Memory unit 30 may be composed of flip-flops, core memories, etc. in which are stored the bits or data elements constituting each of the variable-length code words disclosed in Table I, with each horizontal row or address (hereinafter referred to as "level") of the Code Memory unit 30 storing a different one of the variable length code words. The storage cells 36 of the Mask Memory unit 32 may be of similar construction as that of cells 34 and have stored therein bits which define the length of each variable-length code word stored in the corresponding level of the Code Memory unit 30 in the following manner. Assuming that each level of the Code Memory unit 30 has n storage cells 34 which contain a variable-length code word of i bits, then the n−i storage cells 34 following the cells containing the code word are set to zero. Thus, in the case that the variable-length code word is 001 representing the load operation as shown in Table I, the second level of the Code Memory unit 30 will have the first three storage cells 34 located in the right hand portion thereof containing the code word 001, while the remaining storage cells to the left of those particular cells containing the code word will be set to zero. The correspondingly positioned n−i cells 36 located on the same level in the Mask Memory unit 32 are set to one, while the i storage cells 36 corresponding to the bit location of the variable-length code word are set to zero. Thus, the storage cells 36 containing the zero bits in the Mask Memory unit 32 define the length of the corresponding code word stored in the Code Memory unit 30. As will be explained in greater detail hereinafter, in the operation of the decoder each bit stored in the Comparand Register 20 is effectively compared with each corresponding bit in the same bit position in each level of the Code Memory unit 30 and also with each corresponding bit in the same bit position of each level of the Mask Memory unit 32 by means of an array of logical gate circuits 38 (FIG. 1) from which a binary bit is generated for storage in a Result Register 40 upon the finding of a "match" between each of the bits stored in the same position in the Code Memory unit and in the Mask Memory unit. The location of the binary 1 bit in the Result Register 40 indicates the address of the variable-length code word in the Code Memory unit, which address corresponds to the address of the variable-length code word found in Table I, and therefore the information or "load" instruction represented by the variable-length code word.

Figure 2:
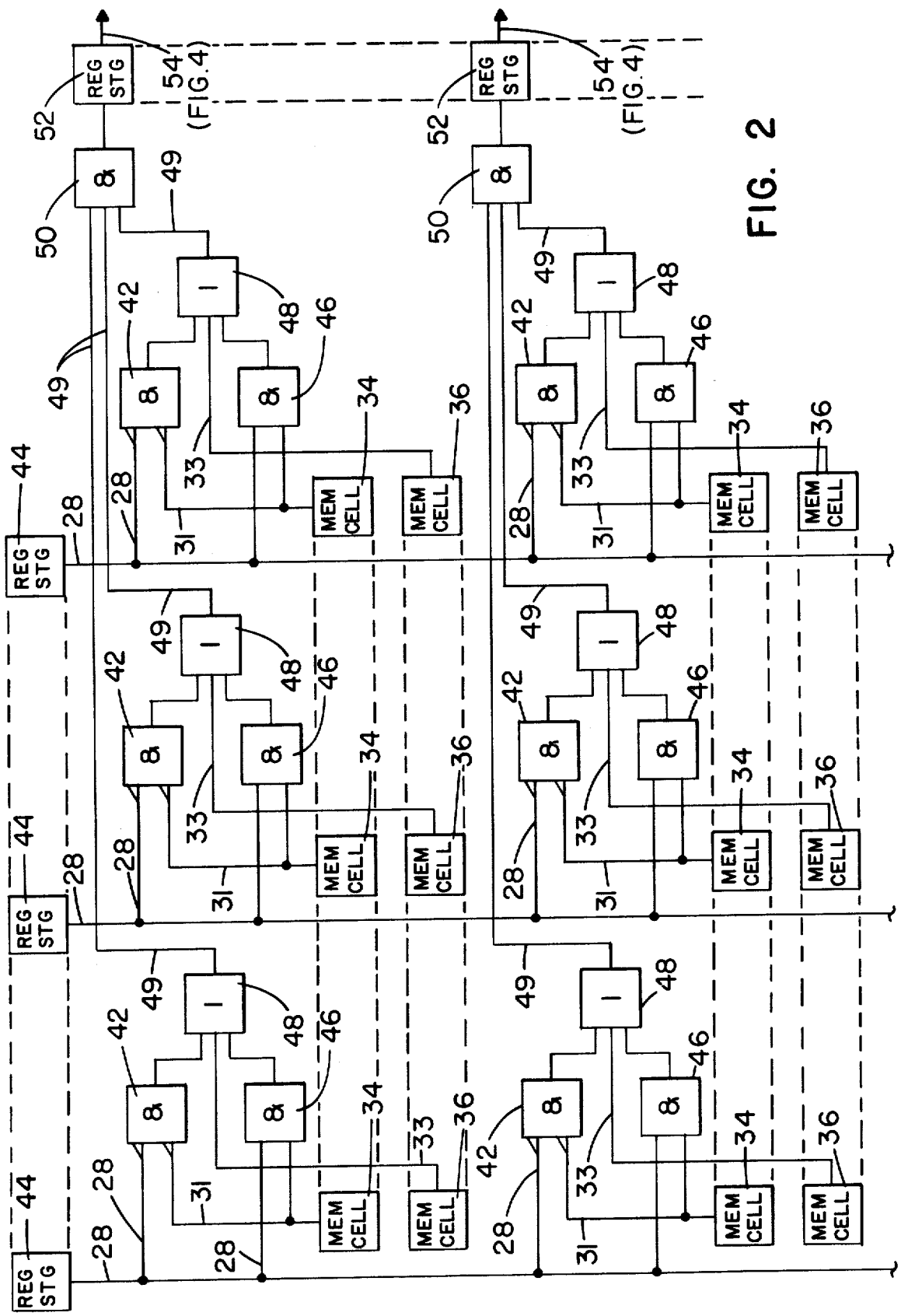
FIG. 2 is a diagram of a portion of the decoding circuit showing the registers, memory units and the coincident circuits used in the circuit.

Referring to FIG. 2, there is shown in detail the logic gate circuits used in the array 30 (FIG. 1) for comparing the bits in the variable-length code word stored in the Register 20 with the corresponding bits stored in the storage cells 34 and 36 of the Code and Mask Memories units, respectively. Each gate circuit preferably includes an AND gate 42 whose inputs are complemented and connected over conductor 28 to a different order storage unit 44 of the Comparand Register 20 and over conductor 31 to a corresponding different order storage cell 34 in the Code Memory unit 30. The outputs of each stage 44 of the Register 20 and the storage cells 34 of the Code Memory unit 30 are also inputted, over conductor 28 and 31 respectively, into an AND gate 46. The outputs of the AND gate 42 and the AND gate 46 are inputted into an OR gate 48 which also includes an input over conductor 33 from the corresponding storage cell 36 of the Mask Memory unit 32. FIG. 3 shows the truth table for the output of the OR gate 48 with respect to the bits stored in the stage 44 of the Register 20, the storage cells 34 of the Code Memory unit 30, and the storage cells 36 of the Mask Memory unit 32. With reference also to FIG. 3, it will be seen that the output of the OR gate 48 is a binary 1 whenever there is a match between the bits stored in the Storage Register 20 and the Code Memory unit 30 or if there is a binary 1 stored in the Mask Memory unit at this location. The output of each of the OR gates 48 in each corresponding level of memories 30 and 32 is inputted over a corresponding conductor 49 into an AND gate 50 whose output is connected to a corresponding stage 52 in the Result Register 40. For the AND gate 50 to output a binary 1 bit, each bit comparison of the same level of the Code and Mask Memory units 30 and 32 must result in a binary 1 output. Since it has been defined that no complete word of the code can be a prefix of some other code word, the result of effectively comparing the variable length code word stored in the Comparand Register 20 with the code words stored in the Code and Mask Memories 30 and 32 will at most produce a single binary 1 from AND gate 50 which is stored in Result Register 40. The particular storage location of the binary 1 bit in Register 40 corresponds to the position or address of the code word in a reference table such as Table I, with the position of the code word in the table corresponding to the storage level of the Code and Mask Memories in which the code word is stored.

Due to the fact that the particular address of the code word in Table I indicates the actual length of the code word, when Register 20 has stored therein two butted variable-length code words of the same or different lengths, knowing the length of the first code word allows the second code word also stored in Register 20 to be shifted to the right in a well-known manner, as viewed in FIG. 1, in order to position the succeeding code word for a subsequent decoding operation.

Figure 4:
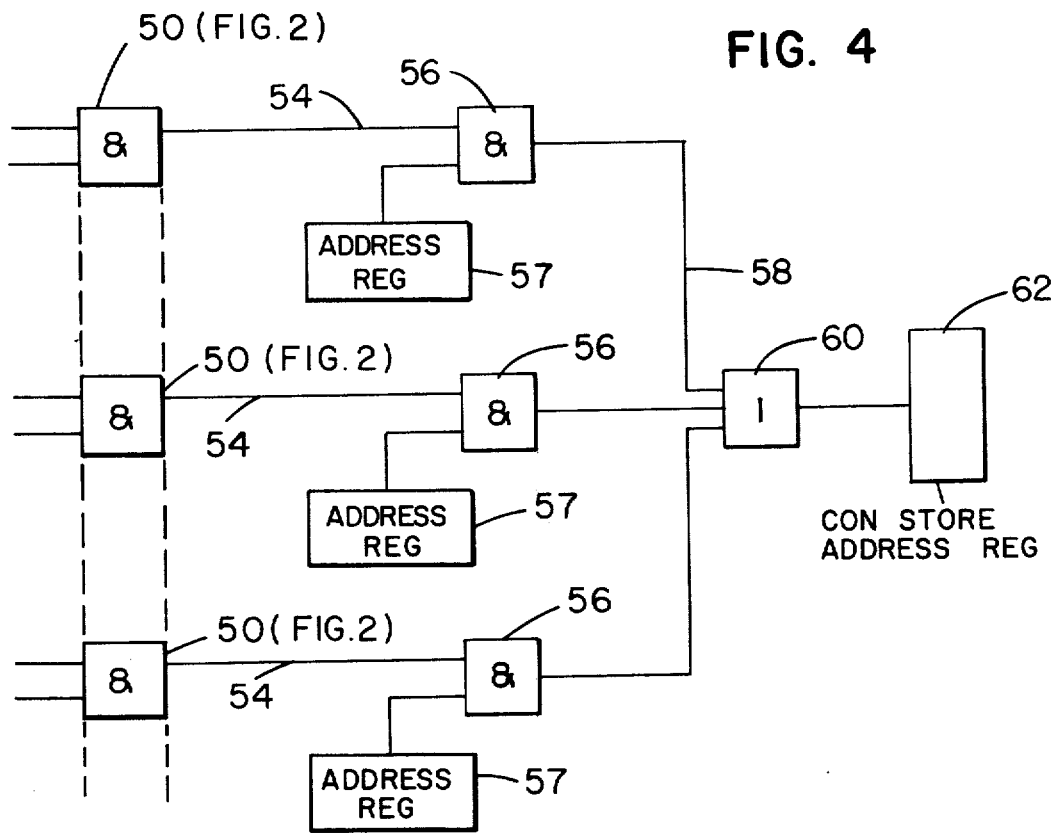
FIG. 4 is a circuit diagram showing how the output signals generated from the decoding circuit disclosed in FIG. 2 may be used to generate an address for use in determining the information represented by the variable length code word.

In the situation where it is undesirable to set a stage in a Register, such as Register 40, as a means of indicating the information represented by a variable-length code word, the output of each of the AND gates 50 may be inputted over line 54 (FIG. 4) to the input of a different one of AND gates 56 whose other input is connected to the output of a Register 57. In this case, Register 57 has stored therein the address of a microprogram capable of interpreting in a well-known manner the variable-length code word which constitutes a computer instruction, the address of which corresponds to the level or address in which the Register 58 is located. Thus, upon the outputting of a binary 1 bit over line 54 from one of the AND gates 50 (FIG. 2) to one of the AND gates 56, the gate 56 is enabled by the output of Register 57 in which the address of the microprogram stored in the associated register 57 is transmitted via conductor 58 through OR gate 60 for loading a Control Store Address Register 62, whereby the address of the microprogram represented by the variable-length code word is used to control the operation of a computer in a well-known manner.

Figure 5:
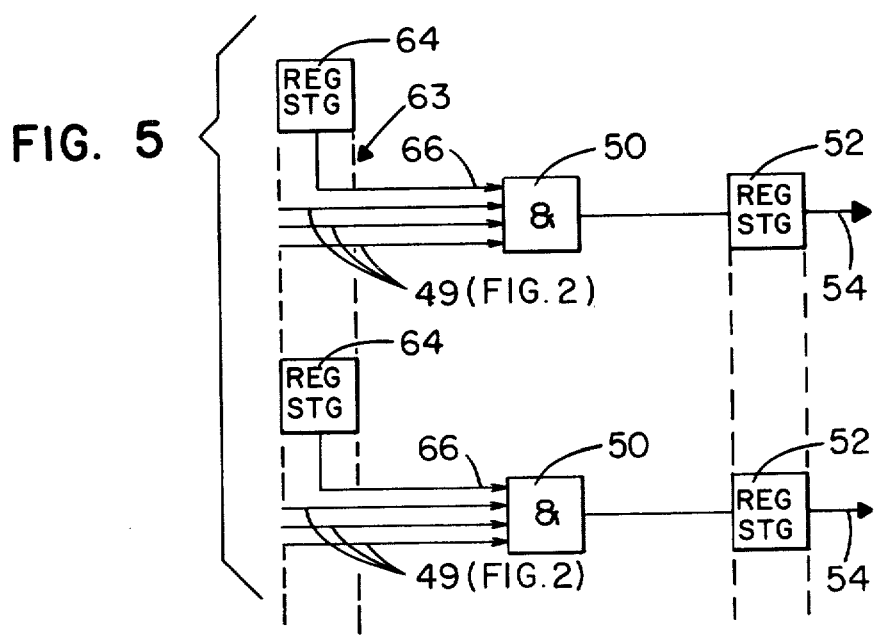
FIG. 5 is a circuit diagram of a portion of FIG. 2 showing the addition of a Length Register for use where the code has fewer code words than those stored in the Code Memory unit.

Referring to FIG. 5, there is shown a portion of the decoding circuit of FIG. 2 in which a Length Register generally indicated by the numeral 63 has been added to enable the decoding circuit to function in a proper manner where the number of variable-length code words being utilized in a system is less than the number of code words stored in the Code and Mask Memories 30, 32. Each stage 64 of the Length Register 63 is outputted over line 66 to one of the AND gates 50 which also receives the output of each of the OR gates 48 (FIG. 2) over line 49. Each stage 64 of the Length Register 63 which is connected to AND gate 50 located in a level of the Code and Mask memories unit 30, 32 containing a valid code word is set to binary 1, thus enabling the operation of that particular AND gate 50. The remaining stages of the Length Register 63 are set to binary 0, thus disabling the operation of its associated AND gate 50. It will thus be seen that the Length Register 63 will limit the number of code words stored in the Code and Mask Memory units that can be applied to decoding the variable-length code word stored in the Comparand Register 20.

While the preferred embodiment of the invention has been described in detail for decoding Huffman codes, it is obvious that other prefix codes can be accommodated by the present embodiment. Furthermore, though binary digits and code words are shown and binary circuit elements have been disclosed, it should be clear that the present techniques are applicable to other than binary systems and that changes may be made to the details of the preferred embodiment without departing from the spirit or scope of the invention as defined in the appended claims. Additionally, while the present exemplary embodiment has been described with respect to code words prearranged in a single dimension as illustrated in Table I, it will be obvious to anyone skilled in the art that the code words may also be arranged in a typical X and Y two-dimensional coordinate array, or, in a typical X, Y and Z three-dimensional coordinate array, without departing from the novel aspects of the present invention.

What is claimed is:

1. Apparatus for decoding an inputted variable-length code word comprising:

a first memory unit having stored therein a plurality of variable-length code words of a coded system, each code word being stored at a predetermined location in said memory unit which location represents the decoded information corresponding to the stored variable-length code word;

a second memory unit having stored therein a length-indicating word for each variable-length word stored in said first memory unit;

first storage means for storing the inputted variable-length code word;

logic means connected to said first storage means and said first and second memory units for comparing the inputted variable-length code word stored in said first storage means with each variable-length code word stored in said first memory unit and for sensing the associated length-indicating word in said second memory unit to output a signal upon finding a coincidence with one of said variable-length code words stored in said first memory unit and the presence of its associated length-indicating word stored in said second memory unit;

and second storage means connected to said logic means for storing said signal in a location in said second storage means in accordance with the location in said first memory unit of said one of said variable-length code words which location in said second storage means represents the decoded information corresponding to the inputted variable-length code word.

2. The apparatus as defined in claim 1 in which said first storage means includes a plurality of first storage locations for storing the inputted variable-length code word and said logic means includes a plurality of logic circuits each associated with one of said first storage location and to corresponding locations in said first and second memory units in which one of said variable-length code words and its associated length-indicating code word is stored, said second storage means includes a plurality of second storage locations each representing decoded information corresponding to one of the variable length code word stored in said first memory unit, the output of each logic circuit being connected to one of said second storage locations whereby said signal is stored in a second storage location in said second storage means in accordance with the location of the word in said first and second memory units in which a coincidence was found in said first memory unit and the presence of a word was found in said second memory unit.

3. The apparatus as defined in claim 2 in which said first and second memory units each includes a predetermined number of correspondingly positioned third storage locations each correspondingly positioned with one of said first storage means, said logic circuits includes first gating means connected to a first storage location in said first storage means and a correspondingly positioned third storage location in said first memory unit to output said signal upon the finding of a coincidence between the words stored in said first and third storage locations, said logic circuits further including second gating means connected to said first gating means and a corresponding third storage location in said second memory unit to output said signal upon the inputting of said signal from either said first gating means or the third storage location in said second memory unit.

4. The apparatus of claim 3 in which said logic circuits further includes a third gating means connected to the output of each of said second gating means associated with a variable-length code word stored in said first memory unit to output said signal to said second storage means upon receiving said signal from each of said second gating means.

5. The apparatus of claim 4 in which said first gating means includes a first AND gate and a second AND gate having complemented inputs connected to corresponding first and third storage locations in said first storage means and said first memory unit for outputting said signal upon finding a coincidence between the code words in said corresponding first and third storage locations.

6. The apparatus of claim 5 in which said second gating means comprises an OR gate connected to each output of said first and second AND gates and a corresponding third storage location in said second memory unit to output said signal upon the finding the presence of said signal in the third storage location in said second memory unit.

7. The apparatus of claim 6 in which said third gating means comprises a third AND gate having an input connected to each of said OR gates and whose output is connected to an associated second storage location in said second storage means for outputting said signal to said second storage location for storage therein upon receiving said signal from each of said OR gates.

8. The apparatus of claim 7 which further includes a fourth storage means means connected to said third AND gate, said fourth storage means having stored therein a control signal for controlling the operation of said third AND gate to control the number of second storage locations in said second storage means that will be enabled to store said signal.

9. An apparatus for decoding an inputted variable-length code word having a number of code elements to derive decoded information represented by the inputted variable-length code word comprising:

- a first memory unit having a plurality of first storage locations functionally arranged in levels, each of said first storage locations including two-state storage elements for storing a code element of a plurality of variable-length code words each stored on a separate level;
- a second memory unit having a plurality of second storage locations functionally arranged in levels and located therein in accordance with the location of a corresponding first storage location in said first memory unit, each of said second storage locations including a two-state storage element for storing a code element of a length-defining code word for each of said variable-length code words stored in said first memory unit, said length-defining code word being stored on the same level in the second memory unit as the level on which its associated variable-length code word is stored in the first memory unit;
- a first storage unit having a plurality of third storage locations each located therein in accordance with the location of a corresponding first storage location in said first memory unit, each third storage location comprising a two-state storage element for storing a code element of an inputted variable-length code word;
- logic means coupled to each third storage location in said first storage unit and a correspondingly-located first and second storage locations in each level of said first and second memory units for comparing the code elements stored therein and for sensing the associated length-defining word in said second memory unit for outputting a control signal upon the finding of a coincidence between the code elements of the inputted variable-length code word and one of said variable-length code words stored in said first memory unit and the presence of its associated length-defining word in said second memory unit;
- and a second storage unit having a plurality of fourth storage locations each including a two-state storage element, each of said fourth storage locations connected to the output of a logic means associated with the same level in said first and second memory units for storing said control signal, each of said fourth storage locations representing the decoded information corresponding to the inputted variable-length code word.

10. The apparatus as defined in claim 9 in which said logic means includes a plurality of first gating circuit means connected to a third storage location in said first storage means and a corresponding first storage location in said first memory unit to output said control signal upon the finding of a coincidence between the code elements stored in said third and first storage locations, said logic means further including second gating circuit means connected to each of said first gating circuit means and a corresponding second storage location in said second memory unit to output said control signal upon receiving said control signal from said first gating means or sensing a code element corresponding to said control signal stored in the second storage location in said second memory unit.

11. The apparatus of claim 10 in which said logic means further includes a third gating circuit means connected to each of said second gating circuit means associated with each level in said first and second memory units to output said control signal upon receiving said control signal from each of said second gating circuit means.

12. The apparatus of claim 11 in which said first gating circuit means includes a first AND gate having complemented inputs and a second AND gate each connected to corresponding third and first storage locations in said first storage means and said first memory unit for outputting said control signal upon finding a coincidence between the code elements stored in said third and first storage locations.

13. The apparatus of claim 12 in which said second gating circuit means comprises an OR gate connected to the outputs of said first and second AND gates, said OR gate further connected to a corresponding second storage location in said second memory unit to output said control signal upon finding the presence of a code element corresponding to said control signal in said second storage location.

14. The apparatus of claim 13 in which said third gating means comprises a third AND gate having inputs connected to each of said OR gates and whose output is connected to an associated fourth storage location in said second storage unit for storing in said associated fourth storage location said control signal representing the variable-length code word stored in said first memory unit which coincides with the inputted variable-length code word stored in said first storage unit.

15. The apparatus of claim 14 which further includes a third storage unit having a plurality of fifth storage locations, each of said fifth storage locations connected to one of said third AND gates for controlling the operation of said third AND gates to limit the number of said fourth storage locations that is available for storing said control signal.

16. Apparatus for decoding a plurality of inputted variable-length code words each comprising a number of code elements in which a binary signal is derived representing the decoded information corresponding to the inputted variable-length code word comprising:

- a first memory unit having stored therein the code elements of a plurality of reference code words comprising all the variable-length code words of a coded system, each reference code word stored at a level in said memory unit which represents the decoded information corresponding to the stored reference code word;
- a second memory unit having stored therein the code elements of a length-indicating word for each reference code word stored in said first memory unit, each length indicating word stored at a level in said second memory unit corresponding to the level on which its associated reference code words stored in said first memory unit;

first storage means for storing the inputted variable-length code word at a location in said storage means corresponding to the location of the reference code words stored in each level in said first memory unit;

a plurality of first logic means each coupled to a location in said first storage means and corresponding locations in said first and second memory units for comparing the code elements of the inputted variable-length code word with the code elements of each reference code word and for sensing the code elements in its corresponding length-indicating word to output said binary signal upon finding a coincidence between the code elements of said inputted variable-length code word and one of said reference code words stored in said first memory unit and the presence of a predetermined code element in the corresponding length-indicating word;

a plurality of second logic means each associated with a selected level in said first memory unit and connected to the output of said first logic means associated with the reference code word stored in said selected level to output said binary signal upon receiving said binary signal from each of said first logic means;

means responsive to the generation of said binary signal to generate an address of the decoded information represented by the inputted variable-length code word;

and second storage means connected to said address generating means for storing said address for use in selecting said decoded information from an information storage unit.

17. A method of decoding an inputted variable-length code word in which a signal is generated representing the decoded information corresponding to an inputted variable-length code word comprising the steps of:

storing in a multi-level first memory unit all the variable-length code words of a coded system, each of said variable-length code words being stored on a level of said first memory unit which indicates the decoded information represented by the variable-length code word stored on said level;

storing in a multi-level second memory unit an associated length-defining word on a level corresponding to a variable-length code word stored on the same level in said first memory unit;

matching the inputted variable-length code word with each variable-length code word and its associated length-defining code word stored in said first and second memory units;

and generating an information representing signal upon the finding of a match between the inputted variable-length code word and one of said variable-length code words stored in said first memory unit together with its associated length-defining code word stored in said second memory unit.

18. A method of decoding an inputted variable-length code word of a coded system having i number of binary signals into a information representing binary signal comprising the steps of:

storing in each level of a multi-level first memory unit one of all of the variable-length code words of said coded system, each level having n number of storage elements with the i number of binary signals of each variable-length code word stored in a first portion of the storage elements and a first predetermined binary signal stored in the remaining $n-i$ storage elements;

storing in each level of a multi-level second memory unit a length-defining word corresponding to the variable-length code word stored on the corresponding level in said first memory unit, each level of said second memory unit having n number of storage elements with the storage elements corresponding to the location of the i number of binary signals of the associated variable-length code word containing said first binary signal with the remaining $n-i$ storage elements storing a second predetermined binary signal;

comparing each binary signal stored in the i number of storage elements of the inputted variable-length code word with each corresponding binary signal of the variable-length code words stored in said first memory unit;

sensing the second binary signals of the corresponding length-defining word stored in the remaining $n-i$ storage elements on the corresponding level in said second memory unit;

generating an information representing signal upon the finding of a coincidence between the binary signals of the inputted variable-length code word and one of said variable-length code words stored on a predetermined level in said first memory unit and the sensing of said second binary signals in the corresponding level in said second memory unit;

and identifying the information represented by the inputted variable-length code word in accordance with the level of said first memory unit from which the information representing signal is generated.

* * * * *